United States Patent
Yang et al.

(10) Patent No.: US 9,799,644 B2
(45) Date of Patent: *Oct. 24, 2017

(54) FINFET AND TRANSISTORS WITH RESISTORS AND PROTECTION AGAINST ELECTROSTATIC DISCHARGE (ESD)

(71) Applicant: Taiwan Semiconductor Manufacturing Co., Ltd., Hsin-Chu (TW)

(72) Inventors: Tzu-Yi Yang, Taipei (TW); Kuo-Ji Chen, Wu-Ku (TW); Chien-Yuan Lee, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/746,893

(22) Filed: Jun. 23, 2015

(65) Prior Publication Data

US 2015/0294968 A1 Oct. 15, 2015

Related U.S. Application Data

(63) Continuation of application No. 14/106,936, filed on Dec. 16, 2013, now Pat. No. 9,082,623.

(51) Int. Cl.
| | |
|---|---|
| *H01L 27/02* | (2006.01) |
| *H01L 27/088* | (2006.01) |
| *H01L 27/06* | (2006.01) |
| *H01L 23/528* | (2006.01) |
| *H01L 49/02* | (2006.01) |
| *H01L 29/78* | (2006.01) |

(52) U.S. Cl.
CPC ........ *H01L 27/0288* (2013.01); *H01L 23/528* (2013.01); *H01L 27/0629* (2013.01); *H01L 27/0886* (2013.01); *H01L 28/20* (2013.01); *H01L 29/785* (2013.01); *H01L 2924/0002* (2013.01)

(58) Field of Classification Search
CPC .. H01L 29/7831; H01L 29/76; H01L 27/0288
USPC ................................. 257/363, 329
See application file for complete search history.

(56) References Cited

U.S. PATENT DOCUMENTS

| | | | |
|---|---|---|---|
| 8,689,166 B2* | 4/2014 | Lu ...................... | G06F 17/5036 |
| | | | 716/104 |
| 2007/0018239 A1 | 1/2007 | Chen et al. | |
| 2014/0061801 A1* | 3/2014 | Doornbos et al. ............ | 257/351 |

\* cited by examiner

*Primary Examiner* — Marc Armand
(74) *Attorney, Agent, or Firm* — Duane Morris LLP (57) ABSTRACT

A FinFET device includes a plurality of FinFET devices formed on a corresponding plurality of fins in a multilevel interconnect semiconductor device. Each source and each drain is coupled to a metal interconnect level by a metal resistive element that is subjacent the lowermost interconnect level. In one embodiment, a metal segment extending over a plurality of the fins includes contacts to each of the fins, thereby providing subjacent metal resistive elements of different lengths. The plurality of fins and subjacent metal segments are arranged such that each of the FinFET devices has the same total resistance provided by the source and drain metal resistive elements, even though the source metal resistive element and drain metal resistive element associated with the fins may have different lengths. The arrangement provides the same turn-on resistance and the same ESD failure current for each FinFET device.

20 Claims, 6 Drawing Sheets

FINFET AND TRANSISTORS WITH RESISTORS AND PROTECTION AGAINST ELECTROSTATIC DISCHARGE (ESD)

CROSS-REFERENCE TO RELATED APPLICATIONS

This application is a continuation of U.S. patent application Ser. No. 14/106,936, filed Dec. 16, 2013, the contents of which is hereby incorporated by reference as if set forth in its entirety.

TECHNICAL FIELD

The disclosure relates most generally, to semiconductor devices and methods for forming the same, and more particularly to FinFET devices with resistors that provide increased protection against electrostatic discharge damage.

BACKGROUND

FinFET and other MOS transistors are susceptible to damage through electrostatic discharge caused by various different components that combine to form an integrated circuit or other semiconductor device. It is naturally desirable to prevent any ESD damage and to raise the level of current at which ESD failure occurs so that the transistors are less susceptible to ESD damage and have increased functionality.

For MOS transistors that do not utilize silicide block contacts to drain, the ESD current, i.e. the current propagated through electrostatic discharge, may become concentrated in surface areas such as in the light doped drain (LDD) portion of a device disposed between the primary source/drain and the transistor gate. This can cause local heating and can undesirably induce a transistor to turn on in response to conditions that are not intended to turn the transistor on. In particular, the current propagated through electrostatic discharge can undesirably induce a transistor to turn on at lower applied voltage levels than desired. It is often desirable to have all transistors in an array turn on at the same voltage/current conditions. Some previous approaches at addressing this issue, i.e. raising the ESD failure current, $It_2$, have been to add silicide blocks, but this requires extending the distance between the drain and the gate and undesirably requires additional space on the chip. When transistors turn on in conditions not intended for the transistors to turn on, device failure can occur.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

Various embodiments of the disclosure relates to semiconductor devices and methods for forming the same. In various embodiments, the semiconductor device includes FinFET and other MOS transistors. FinFET transistors are field effect transistors formed on fin structures formed over a substrate. In some embodiments the fins are formed in an array and in some embodiments, the fins are parallel to one another in an array.

In some embodiments, methods and structures for forming FinFET and other MOS transistors that use minimal surface area, are resistant to ESD damage, and function properly, are provided.

The semiconductor devices include interconnect structures that include a plurality of interconnect pattern (line) layers having conductive patterns and interconnecting various features in one portion of the die to other features in other features of the die. The interconnect structures are formed of conductive materials such as metal and the semiconductor devices include several interconnect layers in various embodiments. The interconnect layers are often referred to as "metal 1" or "M1" (designating the lowermost interconnect level), "metal 2", "metal 3", and so on. These designations are well known and used in the art to indicate that the conductive lines interconnect features from various locations in the semiconductor device. In some embodiments, the metal interconnect lines connect an array of FinFET transistors to other arrays or other features.

The interconnect layer patterns are also coupled to one another through vias that extend vertically between one or several interconnect layers. The interconnect layer patterns are coupled to external features and can represent bit lines, signal lines, word lines, and various input/output connections in some embodiments. In some embodiments of the disclosure, each of the interconnect structures is formed by a damascene process, in which layers of inter-metal dielectric (IMD) material are deposited, trenches and vias are formed and filled with conductive material (e.g., copper or aluminum or various alloys) and the surface is planarized by chemical mechanical polishing (CMP), although other patterning techniques are used in other embodiments. Although the figures only show one interconnect layer (one interconnect layer in FIGS. 4, and M1 layer 102 in FIG. 5) this is only for ease of illustration and the semiconductor devices in various embodiments of the disclosure have several interconnect layers. For example, the interconnect structure may have 8 to 15 interconnect line layers and 8 to 15 via layers. Although the conductive pattern layers are commonly referred to as "metal" interconnect layers, the conductive pattern may be formed of other conductive materials, such as polycrystalline silicon or other suitable conductive or semiconductor materials in some embodiments.

In some embodiments, an array of FinFET devices is formed on a corresponding array of parallel fin devices and one or more of the interconnect layers, e.g. metal 1, connects the features within the array to one other features in the array or to features external to the array.

Various embodiments of the disclosure provides for utilizing metal features formed at the polysilicon or active area level and beneath the first metal interconnect level, i.e. beneath the interconnect level designated and commonly known as "M1" or "metal 1". Metal segments formed from the subjacent metal material formed at the polysilicon or active area level act as resistive elements at the source and drain. These horizontal resistive elements at the source and drain form a parasitic NPN bipolar device between the source and drain to decrease the likelihood of an ESD event undesirably turning on a transistor and also increase the $It_2$ current. The metal segments acting as horizontal resistive elements contribute to a voltage drop and reduces $V_{ds}$, the voltage between the source and the drain of the parasitic bipolar device which increases the ESD failure current, $I_{t2}$ level of the device. The resistive elements, designated M0OD resistive elements, are also arranged such that the same $It_2$ is produced for each FinFET in an array of FinFET devices, and will alternatively be referred to as "resistors" for ease of description.

The metal segments are formed to various lengths, widths and thicknesses in various embodiments. A metal resistor is coupled to both the source and drain of a particular fin in various embodiments. One or multiple segments of an M0OD material are coupled to drains of FinFET transistors formed in an array of fins and one or more M0OD segments are formed to contact the source side of the FinFET transistors formed in the array of fins. The M0OD segments are coupled to the respective fins at the source and drain locations such that the same total resistance is produced for each transistor in an array of FinFET transistors, as will be shown. By maintaining the same total resistance (the total resistance of the M0OD resistor coupled to the source plus the M0OD resistor coupled to the drain) for each transistor in an array of FinFET transistors, the same turn on resistance, $R_{on}$, is maintained for each fin. In this case, a current created by an ESD (electrostatic discharge) event will not cause one of the transistors to undesirably turn on because the ESD current flows through the array of FinFET transistors uniformly and each current path (e.g., the current path through fin 1, fin 2, fin 3 . . . fin 8) has the same length and the same $R_{on}$. Therefore, $It_2$ will be the same for all of the FinFETs. This increases ESD endurance and increases $It_2$, the current level at which an ESD current can undesirably turn on the transistor.

Various embodiments of the disclosure are directed to non-silicide-block MOS transistors in some embodiments, i.e. the source/drain regions of the FinFET device on the fin do not include a silicide block formed thereon.

Figure 1:
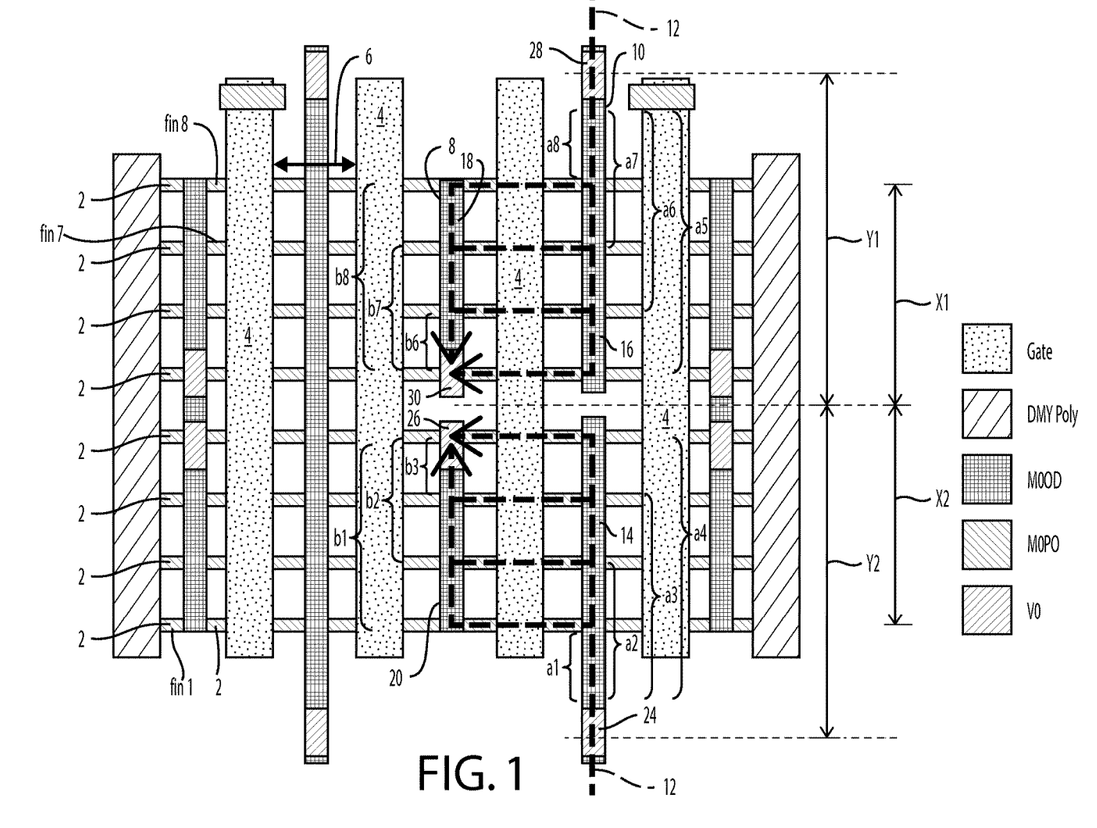
FIG. 1 is a plan view showing general aspects of a layout of an array of FinFET transistors according to some embodiments of the disclosure.

FIG. 1 is a plan view showing aspects of a layout of an array of FinFET devices that utilize M0OD resistors. M0OD resistors are so designated because they represent a metal level beneath the lowermost metal interconnect layer that may be commonly known as metal 1 or M1. The M0OD resistors are formed at the polysilicon level, the active area level or any other level underneath M1. FIG. 1 shows a plurality of fins 2 and in the illustrated embodiment, there are eight fins 2 including identified fin 1, fin 7 and fin 8, labeled as examples. The array of FinFET transistors are silicide block-free FinFET transistors according to some embodiments of the disclosure. Multiple FinFET transistors are formed on each of the fins and each includes a source, drain and gate. While FIG. 1 identifies "source" and "drain," this is done for ease of description and it is understood that the two source/drain structures are interchangeable. The illustrated array includes four gates 4 and a FinFET transistor is formed at each location at which gate 4 crosses an associated fin 2. The FinFET transistor structures associated with the third gate 4 (going left-to-right) and formed to include source regions 8 and drain regions 10 are described in detail herein. Gates 4 are formed of polysilicon or other suitable gate materials. Fins 2 are formed of silicon in some embodiments, SiGe in other embodiments, and other suitable transistor channel materials in other embodiments.

M0OD segments 14 and 16 are coupled to the drains of various FinFET transistors at drain region 10 and M0OD segments 18 and 20 are coupled to the sources of various FinFET transistors at source regions 8. Each M0OD segment 14 and 16 forms four M0OD resistors and each M0OD segment 18 and 20 also forms four M0OD resistors.

M0OD segment 14 includes contacts to each of fins 1-4 and M0OD segment 16 includes contacts to each of fins 5-8 on the drain 10 side of the respective FinFET transistors. M0OD segments 14 and 16 are co-linear. M0OD segment 14 is also coupled to contact structure 24 and M0OD structure 16 is coupled to contact structure 28. Contact structures 24 and 28 are at the same node and are coupled together in various embodiments and as will be shown in FIG. 4. The length of the M0OD resistor produced by M0OD segment 14 and associated with fin 1 is represented by a1 and the length of the M0OD resistor produced by M0OD segment 14 and associated with fin 2 is represented by a2. The length of the M0OD resistor produced by M0OD segment 14 and associated with fin 3 is represented by a3 and the length of the M0OD resistor produced by M0OD segment 14 and associated with fin 4 is represented by a4. The length of the M0OD resistor produced by M0OD segment 16 and associated with fin 5 is represented by a5 and the length of the M0OD resistor produced by M0OD segment 16 and associated with fin 6 is represented by a6. The length of the M0OD resistor produced by M0OD segment 16 and associated with fin 7 is represented by a7 and the length of the M0OD resistor produced by M0OD segment 16 and associated with fin 8 is represented by a8.

M0OD segment 20 includes contacts to the source 8 regions of each of fins 1-4 and is co-linear with M0OD segment 18 which includes contacts to each of fins 5-8. The length of the M0OD resistor produced by M0OD segment 20 and associated with fin 1 is represented by b1 and the length of the M0OD resistor produced by M0OD segment 20 and associated with fin 2 is represented by b2. The length of the M0OD resistor produced by M0OD segment 20 and associated with fin 3 is represented by b3 and the length of the M0OD resistor produced by M0OD segment 20 and associated with fin 4 is represented by b4.

The length of the M0OD resistor produced by M0OD segment 18 and associated with fin 5 is represented by b5 and the length of the M0OD resistor produced by M0OD segment 18 and associated with fin 6 is represented by b6. The length of the M0OD resistor produced by M0OD segment 18 and associated with fin 7 is represented by b7 and the length of the M0OD resistor produced by M0OD segment 18 and associated with fin 8 is represented by b8.

In essence, each M0OD segment 14, 16, 18 and 20 produces four resistors out of one discrete segment of material.

ESD current paths 12 are schematic representations superimposed on FIG. 1 to indicate how a potential ESD current may be directed in the event of an ESD event according to the arrangement of the embodiment shown in FIG. 1. According to the illustrated embodiment, ESD current path 12 represents a current that may be generated by an ESD event. This current that flows along ESD current path 12 flows from contact structure 24 which is considered to be at one electrical node, to contact structure 26 which is at another electrical node and will encounter the same total path resistance. Stated alternatively, the current that flows along ESD current path 12 encounters the same total length of M0OD segments, whether the current flows through fin 1, fin 2 fin 3 or fin 4, according to an embodiment in which M0OD segments 14, 16, 18 and 20 have the same thickness and the same width. By maintaining the same total resistance (source and drain segments) for each transistor in an array of FinFET transistors, the same turn on resistance, $R_{on}$, is established for each fin. In this case $It_2$ is the same for all of the FinFETs and a current created by an ESD (electrostatic discharge) event will not cause one of the transistors to undesirably turn on. The ESD current flows through fins 1-8 uniformly, because each current path (through fin 1-8) is of the same length and thus has the same $R_{on}$.

Fins 2, gates 4 and other features are formed to various suitable dimensions and spacings. Distance 6 between adjacent gates 4 takes on various dimensions in various embodiments. Contact structures 24, 26, 28, 30 provide contact to the M0OD resistors, as will be shown in FIG. 2 and may be formed of multiple materials subjacent the lowermost interconnect level.

In the described embodiment of FIG. 1, for each of the FinFET transistors formed on an associated fin 2, the total resistance of the pair of M0OD resistors is the same on each fin.

Figure 2:
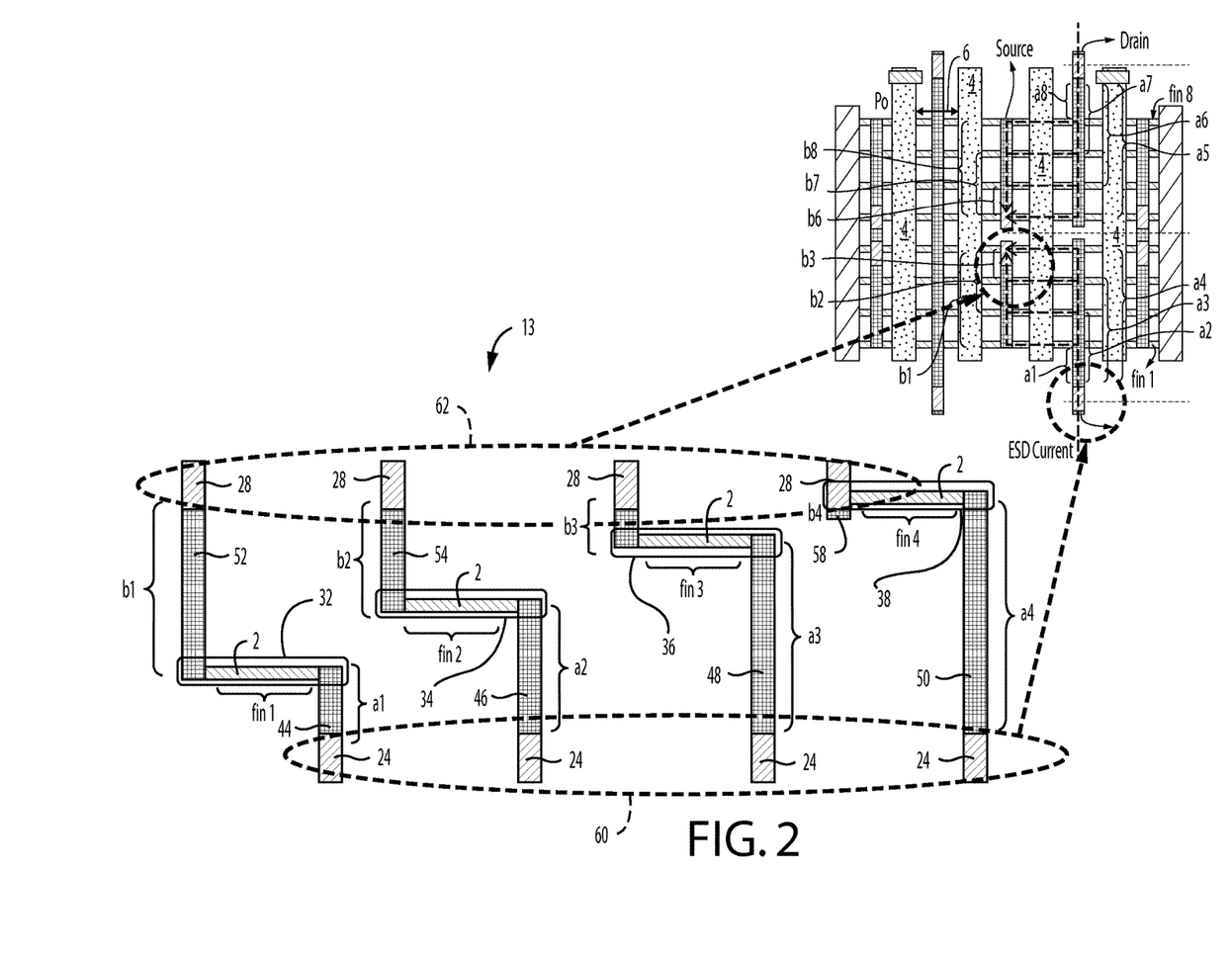
FIG. 2 shows FIG. 1 and an expanded and exploded portion thereof, and which shows further details of individual features according to some embodiments of the disclosure.

FIG. 2 shows the arrangement shown in FIG. 1, with an expanded portion to show further details of the arrangement of the M0OD resistors in accordance with some embodiments of the disclosure.

Expanded portion 13 of FIG. 2 schematically shows the lower portion of the structure of FIG. 1 in further detail. FIG. 2 shows FinFET transistors 32, 34, 36, and 38 separately for clarity. FinFET transistor 32 is associated with fin 1, FinFET transistor 34 is associated with fin 2, FinFET transistor 36 is associated with fin 3, and FinFET transistor 38 is associated with fin 4. M0OD resistor 44 has length a1, M0OD resistor 46 has length a2, M0OD resistor 48 has length a3, M0OD resistor 50 has length a4, M0OD resistor 52 has length b1, M0OD resistor 54 has length b2, M0OD resistor 56 has length b3, and M0OD resistor 58 has length b4. Although expanded portion 13 of FIG. 2 shows M0OD resistors 44, 46, 48 and 50 as separate structures it should be understood that these resistors are formed from one M0OD segment 14 which includes contact to respective fins 1-4 and FinFET transistors 32, 34, 36 and 38. Similarly, although M0OD resistors 52, 54, 56 and 58 are shown as discrete segments, it should be understood that these resistors are formed from M0OD segment 16 which includes contact to each of FinFET devices 32, 34, 36 and 38.

FIG. 2 shows that the total length, and therefore the total resistance, of M0OD resistors 44 plus 52 having lengths a1 plus b1 is the same as M0OD resistors 46 and 54 having lengths a2 plus b2 and also the same as the total resistance of M0OD resistors 48 and 56 having lengths a3 plus b3 and also M0OD resistors 50 and 58 having lengths a4 plus b4, according to an embodiment in which M0OD resistors 44, 46, 48, 50, 52, 54, 56, 58 are formed of the same material and have the same thickness and width. Stated mathematically, total lengths of the M0OD resistors (and therefore total resistance for an embodiment in which M0OD segments 14 and 20 have the same thickness and the same width) is expressed mathematically as: a1+b1=a2+b2=a3+b3=a4+b4. In some embodiments, such as in FIG. 1, this is also true for the M0OD resistors associated with the FinFET transistors formed on fins 5-8, i.e. a1+b1=a2+b2= . . . a8+b8.

Figure 3:
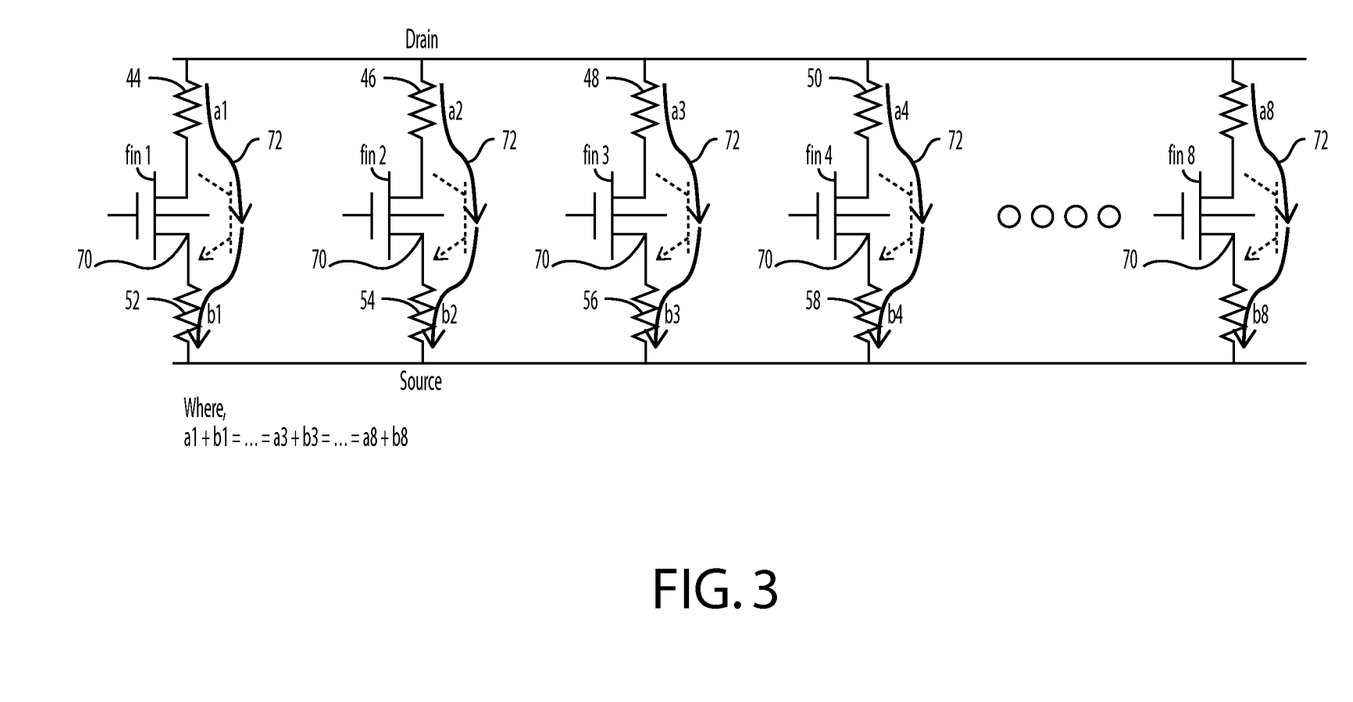
FIG. 3 is a circuit diagram showing a series of parallel fins with subjacent metal resistors according to some embodiments of the disclosure.
Figure 4:
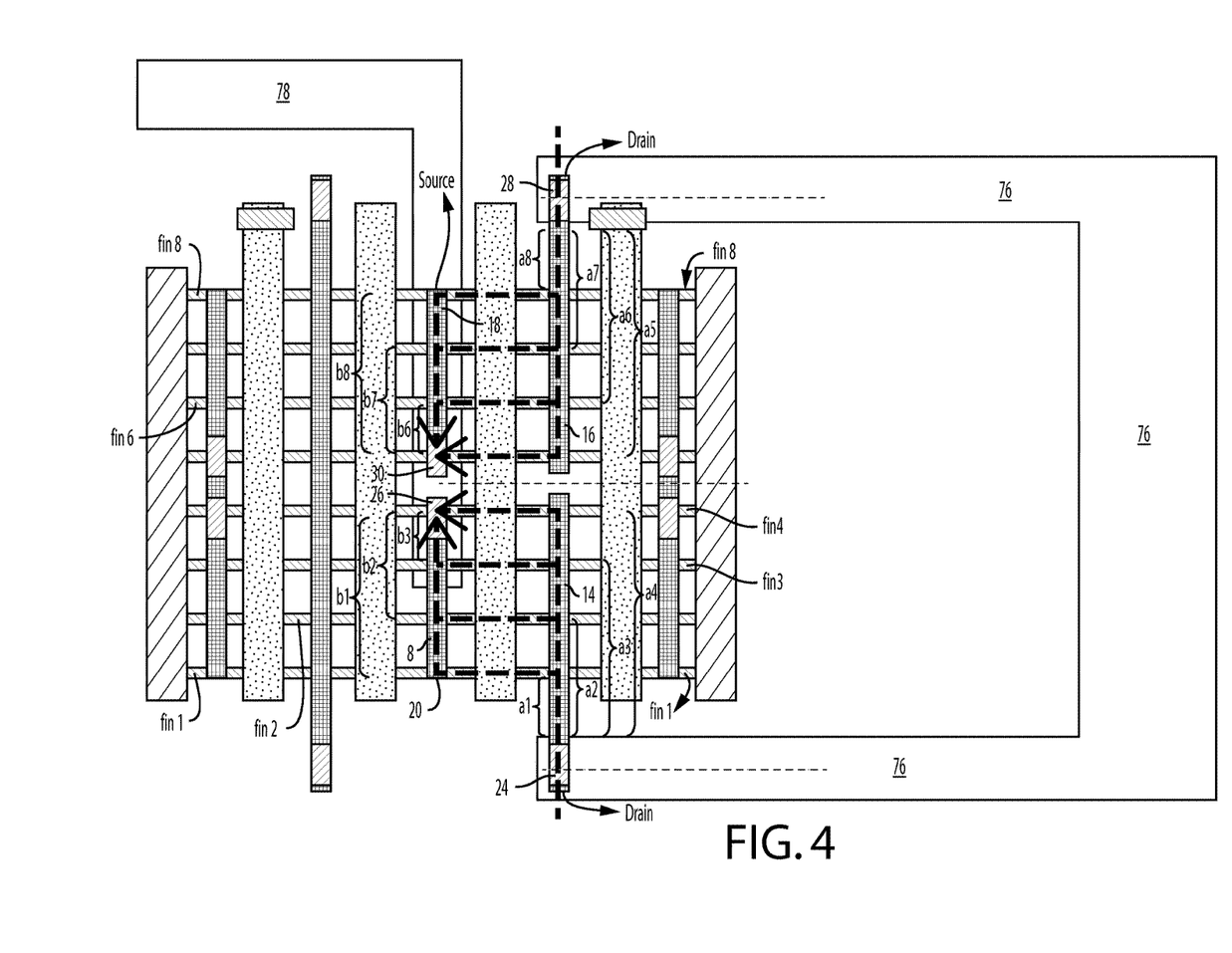
FIG. 4 shows the layout of the array of FinFET transistors of FIG. 1, with further features according to some embodiments of the disclosure.

Still referring to FIG. 2, M0OD resistors 44, 46, 48 and 50 share common contact structure 24, which represents one node 60 and such as will be shown in FIGS. 3 and 4. Again, although contact structures 24 are illustrated as separate structures in FIG. 2, this is done to illustrate the M0OD resistors 44, 46,48 and 50 separately and it should be understood that there is one contact structure 24 and that four M0OD resistors 44, 46,48 and 50 represent different portions of one M0OD segment 14. Similarly, M0OD resistors 52, 54, 56 and 58 share common contact structure 28 which represents different node 62, which will be shown in FIGS. 3 and 4. Contact structures 24 and 28 are formed of one or more layers of various suitable metals or polysilicon or other suitable conductive materials in various embodiments. M0OD resistors 44, 46, 48, 50, 52, 54, 56 and 58 are formed of a metal segment formed at the polysilicon or active area level and beneath the lowermost metal interconnect layer, as will be shown in the cross-sectional view of FIG. 5. M0OD resistors 44, 46, 48, 50, 52, 54, 56 and 58 are formed of various suitable conductive materials in various embodiments.

FIG. 3 is a circuit diagram showing aspects of embodiments of the disclosure and includes fin 1, fin 2, fin 3, etc. that correspond to fin 1, fin 2, fin 3, etc. of FIGS. 1-2. Each fin includes an associated transistor with a transistor channel formed on the identified fin, as shown in FIG. 3 FIG. 3 shows M0OD resistors 44, 46, 48 and 50 that represent parts of M0OD segment 14 and M0OD resistors 52, 54, 56 and 58 that represent parts of M0OD segment 20 and correspond to the M0OD resistors of FIGS. 1 and 2. FIG. 3 shows how the same $R_{on}$, turn on resistance, is maintained for each fin. M0OD resistors 44, 46, 48 and 50 are coupled to the drains of the associated FinFET transistor and M0OD resistors 52, 54, 56 and 58 are coupled to the sources thereof and it can be seen that each fin act as a NPN-BJT, bipolar junction transistor in allowing some current to flow. When an EDS event occurs, the drain side voltage of the FinFET transistors of the array (e.g., FinFET devices 32, 34, 36 and 38 of FIG. 2) increases. If this increased voltage on the drain sides, reaches the trigger voltage, $V_{t1}$, the parasitic NPN-BJT (NPN-Bipolar junction transistor) will turn on to discharge ESD current. ESD failure current, $I_{t2}$ represents the maximum current that the FinFET device can withstand before this failure mode (the NPN-BJT turning on to discharge ESD current) occurs. $I_{t2}$ can thus be considered the failure current of the associated BJT. FIG. 3 shows parasitic bipolar devices 70 created as a result of the M0OD resistors according to embodiments of the disclosure. Current flow path 72 indicates current flow through the associated parasitic bipolar devices 70.

FIG. 3 covers an embodiment in which the total resistance of the two M0OD resistors coupled to the source and drain, is the same for each of the FinFET devices formed on fins 1-8. In FIG. 3, the total resistance of the two resistors on fin 1 is equal to the total resistance of the two resistors on fin 2 and each of the other fins. Stated alternatively, as indicated in FIG. 3, lengths a1+b1= . . . =a3+b3= . . . =a8+b8, in which ax and bx (i.e. a1, . . . a3, . . . a8 and b1, . . . b3, . . . b8) each represent resistance. According to the embodiment in which M0OD segments 14 and 20 have the same thickness and the same width in which resistance varies directly with length, this also represents that also the total resistance on each of the fins is the same. In this manner, each fin has a FinFET transistor with the same turn on resistance, $R_{on}$. The BJT allows some currents to flow and can accommodate current generated by ESD events thereby preventing the ESD current generated from undesirably turning on the associated FinFET transistor.

FIG. 4 shows the layout of FIG. 1 and additionally includes interconnect structures 76, 78. Interconnect structures 76, 78 are formed at the same metal level and represent the lowermost level of metal interconnect structures in the semiconductor device that also includes the described FinFET array, in some embodiments. In other embodiments, interconnect structures 76, 78 are a $2^{nd}$ or $3^{rd}$ or a higher metal level but M0OD resistors are formed beneath the lowermost interconnect level. According to various embodiments, interconnect structures 76, 78 represent the lowermost metal level of the device having as many as 15 or more metal levels, for example. Interconnect structure 76 couples together M0OD segments 14 and 16 associated with drain region 10 and having been previously indicated as having a common node 60 in FIG. 2. According to this embodiment, M0OD resistors 44, 46, 48 and 50 are formed from M0OD segment 14 and are coupled to the M0OD resistors formed of M0OD segment 16 at node 60 by interconnect structure 76 which couples contact structures 24 and 28 on the drain side. M0OD resistors 52, 54, 56 and 58 formed of M0OD segment 20 are coupled to the M0OD resistors formed of M0OD segment 18 at node 62 by interconnect structure 76 which couples contact structures 26 and 30 on the source side.

Figure 5:
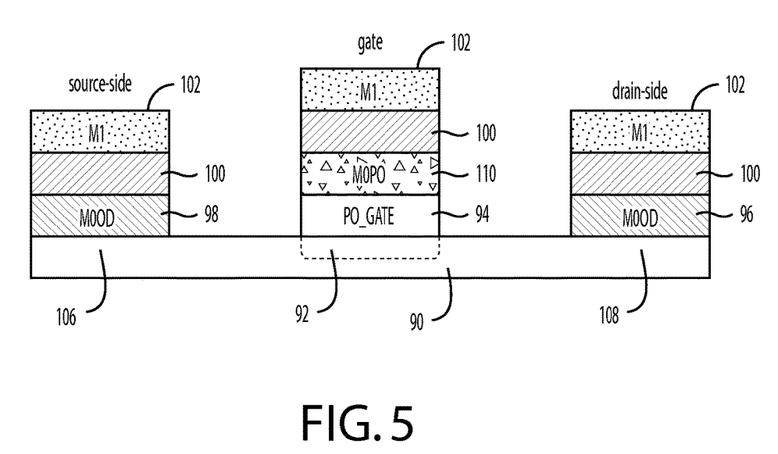
FIG. 5 is a cross-sectional view showing M0OD resistors coupled to a metal interconnect layer on both the source side and drain side of a FinFET device according to some embodiments of the disclosure.

FIG. 5 is a cross-sectional view showing an embodiment of the M0OD resistors. Fin 90 includes a FinFET transistor having channel area 92. Gate 94 is formed of polysilicon or other suitable materials in various embodiments. Gate 94 is disposed over a gate dielectric (not shown) formed on fin 90 and disposed over channel region 92. M0OD resistor 96 is coupled to the drain side of the FinFET transistor formed of fin 90 such as M0OD resistors 44, 46, 48 and 50 are coupled to the drain areas in FIG. 3. M0OD resistor 98 is coupled to the source side of the FinFET transistor formed of fin 90 such as M0OD resistors 52, 54, 56 and 58 are coupled to the source areas in FIG. 3. Contact structures 100 couple M1 interconnect layer 102 to the associated M0OD resistors 96, 98 and therefore also to source 106 and drain 108, though in other embodiments, contact structures 100 couple the associated M0OD resistors 96, 98 to M2 or M3 or other interconnect layers. Contact structures 100 are formed of metal or other suitable conductive materials and are disposed beneath the lowermost metal interconnect layer, M1 interconnect layer 102. In some embodiments, contact structures 100 are each a conductive or semiconductor segment that couples the associated M0OD resistors to an interconnect layer such as at contact structures 24, 28, 26 and 30 of FIG. 1. In some embodiments such as the illustrated embodiment of FIG. 5, further contact structure 110 is used and may be formed of various conductive materials such as metal or polysilicon, and also formed subjacent M1 interconnect layer 102.

Figure 6:
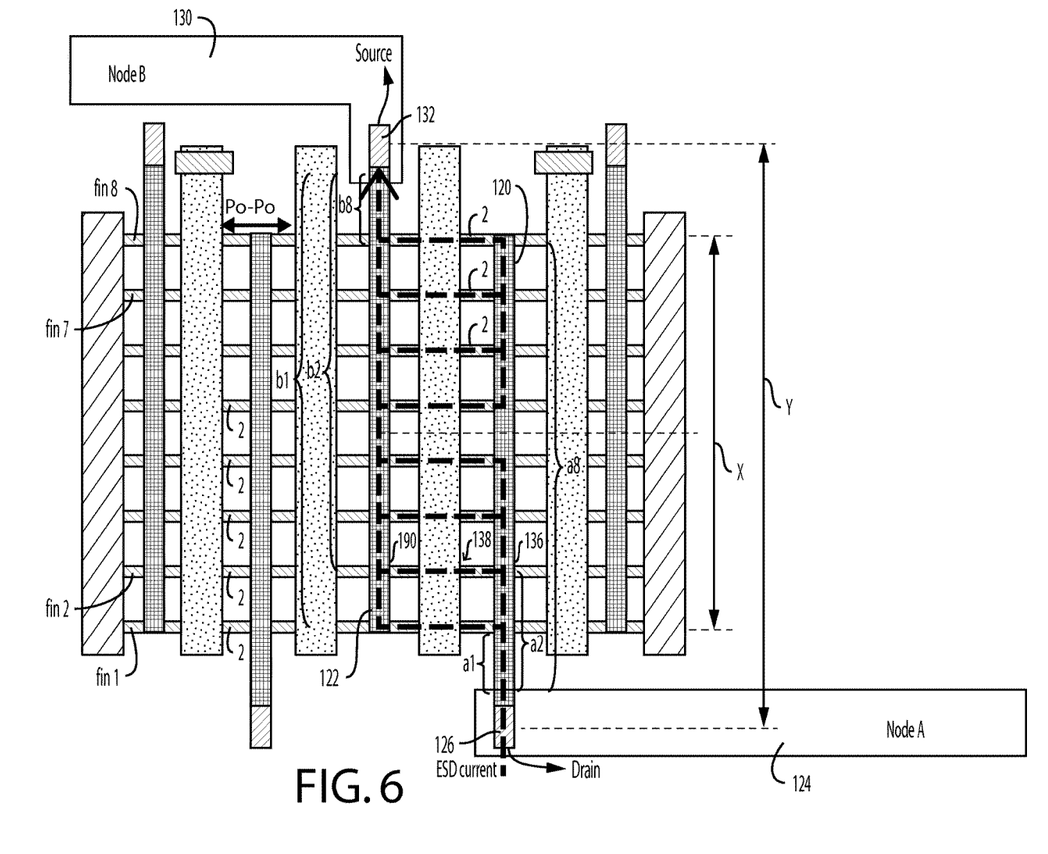
FIG. 6 is a plan view showing an array of FinFET transistors according to other embodiments of the disclosure.

FIG. 6 presents a layout of another embodiment of an arrangement of M0OD resistors. The layout of the array of FIG. 6 has similarities to the layout of the array of FIG. 1 but according to the embodiment of FIG. 6, one segment of an M0OD material, M0OD structure 120 is formed on the drain side and one M0OD structure 122 is formed on the source side. The continuous M0OD structure 120 is coupled to interconnect structure 124 at contact structure 126 and M0OD structure 122 is coupled to interconnect structure 130 at contact structure 132. According to some embodiments, interconnect structures 124, 130 are metal 1 ("M1") interconnect structures. According to the embodiment of FIG. 6, one continuous M0OD structure 120 includes contacts to each of the eight fins 2 on the drain side and one continuous M0OD structure 122 includes contacts to each of the eight fins 2 on the source side.

According to the embodiment of FIG. 6, eight effective resistors are formed from M0OD structure 120 and eight effective M0OD resistors are formed from M0OD structure 122. For example, for fin 2, an M0OD resistor having length a2 is formed from M0OD structure 120 on the drain side and this resistor is coupled to and extends from contact structure 126 to drain region 136 of a FinFET device 138 formed on fin 2. Also coupled to FinFET device 138 on source side 140, is an M0OD resistor formed of M0OD segment 122 and having length b2 and extending from contact structure 132 to fin 2. The effective resistor length of each of the M0OD resistors formed from M0OD segment 120 is represented by the distance from contact structure 126 to the associated fin and the distance for the effective M0OD resistor formed of M0OD structure 122 is the distance from contact structure 132 to the associated fin. In this manner, the length of the two resistors associated with any FinFET device, i.e., the resistor formed on the drain side and the resistor formed on the source side from M0OD segments 120, 122, respectively, is the same. M0OD structure 122 forms eight resistors having length indicated by a1, a2 to a8 as examples and M0OD structure 122 forms eight effective resistors having lengths indicated by b1, b2 to b8, as examples. For example, the effective length of an M0OD resistor formed from M0OD structure 122 associated with fin 1 is the distance from contact structure 126 to fin 1 as represented by a1 and the effective length of an M0OD resistor formed of M0OD structure 122 on the drain side is the distance from contact structure 132 to fin 1.

According to one aspect, a semiconductor device is provided. The semiconductor device comprises: a plurality of FinFET devices formed in a semiconductor device having a plurality of metal interconnect levels including a lowermost metal interconnect level, each FinFET device having an associated fin, a gate and opposed source and drain regions, each source region coupled to one of the metal interconnect levels by a corresponding source contact structure that includes a subjacent source metal resistive element that is subjacent the lowermost metal interconnect level, and each drain region coupled to one of the metal interconnect levels by a corresponding drain contact structure that includes a subjacent drain metal resistive element that is subjacent the lowermost metal interconnect level.

In some embodiments, the plurality of fins are parallel fins and the subjacent drain metal resistive element is coupled to the lowermost metal interconnect level by a corresponding further metal segment or a polysilicon structure.

In some embodiments, the plurality of fins are parallel fins and each the subjacent drain metal resistive element is a portion of a common subjacent drain metal segment coupled to each of the fins.

In some embodiments, each subjacent source metal resistive element is a portion of a common subjacent source metal segment coupled to each of the fins.

In some embodiments, each subjacent drain resistive element has a different length.

In some embodiments, each subjacent source metal resistive element is a portion of a common subjacent source metal segment coupled to each of the fins and each the subjacent drain resistive element has a different length.

In some embodiments, the plurality of fins are parallel fins and each subjacent drain metal resistive element is a portion one of a plurality of co-linear subjacent drain metal segments, each coupled to a plurality of the fins and each subjacent source metal resistive element is a portion one of a plurality of co-linear subjacent source metal segments, each coupled to a plurality of the fins.

In some embodiments, a total resistance provided by the corresponding subjacent source metal resistive element and the corresponding subjacent drain metal resistive element is the same for each FinFET device.

In some embodiments, a total resistive element length of the corresponding subjacent source metal resistive element and the corresponding subjacent drain metal resistive element is the same for each FinFET device.

According to another aspect, a semiconductor device is provided. The semiconductor device comprises: a plurality of FinFET devices formed in a semiconductor device having a plurality of metal interconnect levels including a lowermost metal interconnect level, the plurality of FinFET devices formed on a corresponding plurality of parallel fins. Each FinFET device has a gate and opposed source and drain regions; at least one subjacent source metal segment subjacent the lowermost metal interconnect level and coupled to at least one the source region, and at least one subjacent drain metal segment subjacent the lowermost metal interconnect level and coupled to at least one the drain region.

In some embodiments, the at least one subjacent source metal segment comprises two co-linear subjacent source metal segments and the at least one subjacent drain metal segment comprises two co-linear subjacent drain metal segments and wherein each drain region is coupled to one of the two co-linear subjacent drain metal segments and each the source region is coupled to one of the two co-linear subjacent source metal segments.

In some embodiments, each FinFET device thereby has an associated source resistive element formed by one of the at least one subjacent source metal segment and an associated drain resistive element formed by one of the at least one subjacent drain metal segment and wherein a total length of the source resistive element and the drain resistive element is same for each the FinFET.

In some embodiments, for each FinFET device, the associated source resistive element has a different length than the associated drain resistive element.

In some embodiments, each FinFET device thereby has an associated source resistive element formed by one of the at least one subjacent source metal segment and an associated drain resistive element formed by one of the at least one subjacent drain metal segment and wherein a total resistance of the source resistive element and the drain resistive element is same for each FinFET.

In some embodiments, for each FinFET device, the associated source resistive element has a different resistance than the associated drain resistive element.

In some embodiments, each FinFET device thereby has an associated source resistive element formed by one of the at least one subjacent source metal segment and an associated drain resistive element formed by one of the at least one subjacent drain metal segment and the associated source resistive element and the associated drain resistive element form respective source/drain sides of an effective BJT (Bipolar Junction Transistor).

In some embodiments, the at least one subjacent source metal segment and the at least one subjacent drain metal segment are formed at the same device level as polysilicon or active area features and the source and drain structures do not include a silicide block thereon.

According to another embodiment of the disclosure, a semiconductor device is provided and comprises: a plurality of FinFET devices formed in a semiconductor device having a plurality of metal interconnect levels including a lowermost metal interconnect level, the plurality of FinFET devices formed on a corresponding plurality of parallel fins, each FinFET device having a gate and opposed source and drain regions; at least one subjacent source metal segment subjacent the lowermost metal interconnect level and at least one subjacent drain metal segment subjacent the lowermost metal interconnect level. Each source region is coupled to one of the at least one subjacent source metal segment and each drain region is coupled to one of the at least one subjacent drain metal segment.

In some embodiments, each source region is coupled to one of the at least one subjacent source metal segment which forms an associated source resistive element having a resistive element length comprising a distance between the associated source and a source contact, and each drain region is coupled to one of the at least one subjacent drain metal segment to form an associated drain resistive element having a resistive element length comprising a distance between the associated drain and a drain contact.

In some embodiments, each of the source resistive elements has a different length and each of the drain resistive elements has a different length and wherein, for each FinFET device, a total length of the source resistive element and the drain resistive element is the same.

The preceding merely illustrates the principles of various embodiments of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of various embodiments of the disclosure.

What is claimed is:

1. A semiconductor device, comprising:
a plurality of FinFET devices formed in a semiconductor device having a plurality of interconnect levels and including a lowermost interconnect level,
each of said FinFET devices having an associated fin, a gate, and opposed source and drain regions,
each of said opposed source and drain regions coupled to one or more resistive elements that are said formed in one of a polysilicon level or active area level beneath said lowermost interconnect level, and wherein said one or more resistive elements are arranged such that a total resistance of the one or more resistive elements that are coupled to each of said opposed source and drain regions is the same for each FinFET device in said plurality of FinFET devices.

2. The semiconductor device of claim 1, wherein said resistive elements comprise one or more horizontal resistive elements.

3. The semiconductor device of claim 2, wherein said resistive elements comprise one or more vertical resistive elements.

4. The semiconductor device of claim 1, wherein said resistive elements form a parasitic NPN bipolar device between each of said opposed source and drain regions.

5. The semiconductor device of claim 1, wherein a turn on resistance for each of said FinFET devices in said plurality of FinFET devices is the same.

6. The semiconductor device of claim 1, wherein a total resistive element length of said one or more resistive elements between an opposed source and drain region of each of said FinFETs is the same.

7. The semiconductor device of claim 1, wherein said one or more resistive elements are formed in one of a polysilicon level or an active level.

8. The semiconductor device of claim 1, wherein said one or more resistive elements are coupled to at least one of said plurality of interconnect levels.

9. The semiconductor device of claim 1, wherein said one or more resistive elements comprise one or more first resistive elements coupled to each source of said plurality of FinFET devices and one or more second resistive elements coupled to each drain of said plurality of FinFET devices.

10. The semiconductor device of claim 9, wherein said one or more first resistive elements and said one or more second resistive elements are co-linear.

11. The semiconductor device of claim 9, wherein a total resistive length including a first resistive element and a second resistive element between a source and a drain is the same for each of said plurality of FinFET devices.

12. A semiconductor device, comprising:
a plurality of FinFET devices formed in a semiconductor device having a plurality of interconnect levels including a lowermost interconnect level,
each said FinFET device having a gate, a source region, and a drain region;
at least one source resistive element formed in one of a polysilicon layer and/or an active area layer beneath said lowermost interconnect level, said source resistive element coupled to said source region of at least one of said plurality of FinFET devices; and
at least one drain resistive element formed in one of a polysilicon layer and/or an active area layer beneath said lowermost interconnect level, said drain resistive element coupled to said source of said at least one of said plurality of FinFET devices.

13. The semiconductor device of claim 12, wherein said source resistive element and said drain resistive element comprise horizontal resistive elements.

14. The semiconductor device of claim 12, wherein said source resistive element and said drain resistive element form a parasitic NPN bipolar device between each of said opposed source and drain regions.

15. The semiconductor device of claim 12, wherein a turn on resistance for each of said FinFET devices in said plurality of FinFET devices is the same.

16. The semiconductor device of claim 12, wherein a total resistive element length of said at least one source resistive element and said at least one drain resistive element is the same between a source and a drain of each of said plurality of FinFET devices.

17. The semiconductor device of claim 12, wherein said source resistive element and said drain resistive element are co-linear.

18. A semiconductor device, comprising
a plurality of FinFET devices formed in a semiconductor device having a plurality of interconnect levels including a lowermost interconnect level, said plurality of FinFET device formed on a corresponding plurality of parallel fins,
each said FinFET device having a gate, a source region, and a drain region;
a first set of resistive elements including at least one source resistive element formed in one of a polysilicon layer and/or an active area layer beneath said lowermost interconnect level and coupled to a first set of said plurality of FinFET devices at a source region and at least one drain resistive element formed in one of said polysilicon layer and/or said active area layer beneath said lowermost interconnect level and coupled to said first set of said plurality of FinFET devices at a drain region; and
a second set of resistive elements including at least one source resistive element formed in one of said polysilicon layer and/or said active area layer beneath said lowermost interconnect level and coupled to a second set of said plurality of FinFET devices at a source region and at least one drain resistive element formed in one of said polysilicon layer and/or said active area layer beneath said lowermost interconnect level and coupled to said second set of said plurality of FinFET devices at a drain region.

19. The semiconductor device of claim 18, wherein each at least one source resistive element of said first set of resistive elements and each at least one drain resistive element of said first set of resistive elements has a different length, and wherein a total length of said source resistive element and said drain resistive element for each of said FinFET devices is the same.

20. The semiconductor device of claim 19, wherein said total resistance of said source resistive element and said drain resistive element for each of said FinFET devices is the same.

* * * * *